(12) United States Patent
Hsien (10) Patent No.: US 8,847,366 B1
(45) Date of Patent: Sep. 30, 2014

(54) RECTIFIER DIODE

(71) Applicant: Jung-Chi Hsien, Yangmei (TW)

(72) Inventor: Jung-Chi Hsien, Yangmei (TW)

( * ) Notice: Subject to any disclaimer, the term of this patent is extended or adjusted under 35 U.S.C. 154(b) by 0 days.

(21) Appl. No.: 13/796,489

(22) Filed: Mar. 12, 2013

(51) Int. Cl.
*H01L 29/40* (2006.01)
*H01L 21/48* (2006.01)

(52) U.S. Cl.
CPC .................................. *H01L 21/4814* (2013.01)
USPC ........... 257/621; 257/734; 257/762; 257/773; 257/774; 257/E21.597

(58) Field of Classification Search
USPC .......... 257/678–734, 773, E23.001–E23.194, 257/741, E21.499, 621, 762, 774, E21.597
See application file for complete search history.

(56) References Cited

U.S. PATENT DOCUMENTS

| 6,060,776 A * | 5/2000 | Spitz et al. ..................... 257/706 |
| 8,159,072 B2 * | 4/2012 | Huang ........................... 257/774 |
| 2005/0082692 A1 * | 4/2005 | Park et al. ..................... 257/796 |

FOREIGN PATENT DOCUMENTS

TW 101281 9/1997

* cited by examiner

*Primary Examiner* — Jasmine Clark
(74) *Attorney, Agent, or Firm* — Muncy, Geissler, Olds & Lowe, P.C.

(57) ABSTRACT

A rectifier diode includes a substrate defining an even number of through holes, one or a number of bare chip diodes placed on the top surface of the substrate with even number of conducting grooves thereof respectively kept in alignment with respective through holes of the substrate, and a conducting unit including a metal interface layer coated on exposed surfaces of each bare chip diode and the substrate using, a conductive metal thin film covered over the metal interface layer and defining an electroplating space within each through hole of the substrate and the corresponding conducting groove of one bare chip diode and a conducting medium coated in each electroplating space to form an electrode pin and a bond pad.

7 Claims, 13 Drawing Sheets

RECTIFIER DIODE

BACKGROUND OF THE INVENTION

1. Field of the Invention

The present invention relates to rectifier diode technology and more particularly, to such a rectifier diode, which has one or multiple bare chip diodes be directly placed on a substrate and uses a metal interface layer and a conductive metal thin film and predetermined electrode pins and bond pads to secure the bare chip diodes and the substrate tightly together and to electrically couple the bare chip diodes to the circuit in the substrate, eliminating a further packaging process, simplifying the manufacturing process and reducing the manufacturing cost.

2. Description of the Related Art

Figure 12:
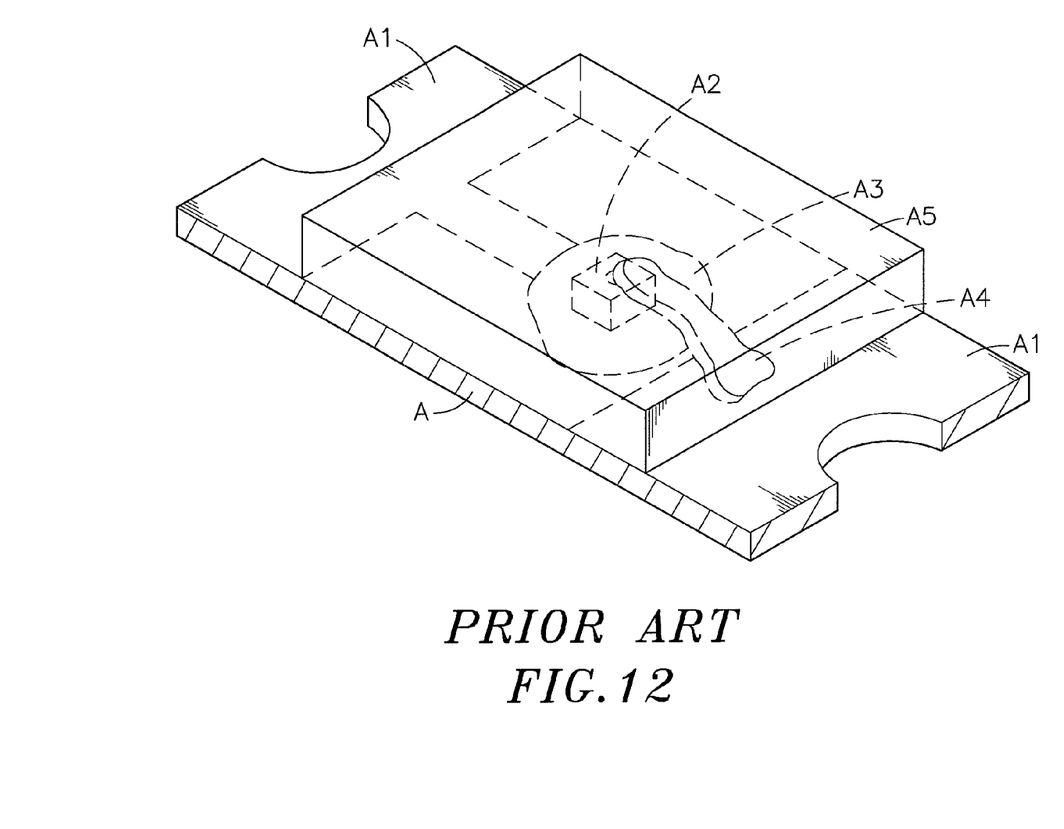
FIG. 12 is a perspective view of a rectifier diode according to the prior art.

With fast development of electronic technology, rectifier diodes are used intensively in different electronic devices to rectify electric current. Taiwan Patent No. 101281, Publication No. 3421841, filed on Sep. 30, 1997, discloses a semiconductor diode device and its fabrication method. According to this design, as shown in FIG. 12, one respective ends of the positive and negative poles of an bare chip diode A2 are bonded to a circuit unit A1 of a substrate A, an adhesive A3 is covered on the substrate A over the bare chip diode A2 and precisely ground to let the other ends of the positive and negative poles of the bare chip diode A2 be exposed to the outside, and then a conducting circuit A4 is formed on the exposed ends of the positive and negative poles of the bare chip diode A2 by printing or vacuum deposition to electrically coupled to the bare chip diode A2 to the circuit in the substrate A, and then a protective cover layer A5 is molded on the substrate A. This method needs to perform adhesive bonding, grinding and wire bonding and encapsulating procedures, complicating the fabrication. Further, the performance of the grinding step tends to result in a precision error, leading to a defective product. Further, the wiring bonding and encapsulating procedures need to use different processing tools, increasing the equipment installation cost and the product fabrication cost.

Figure 13:
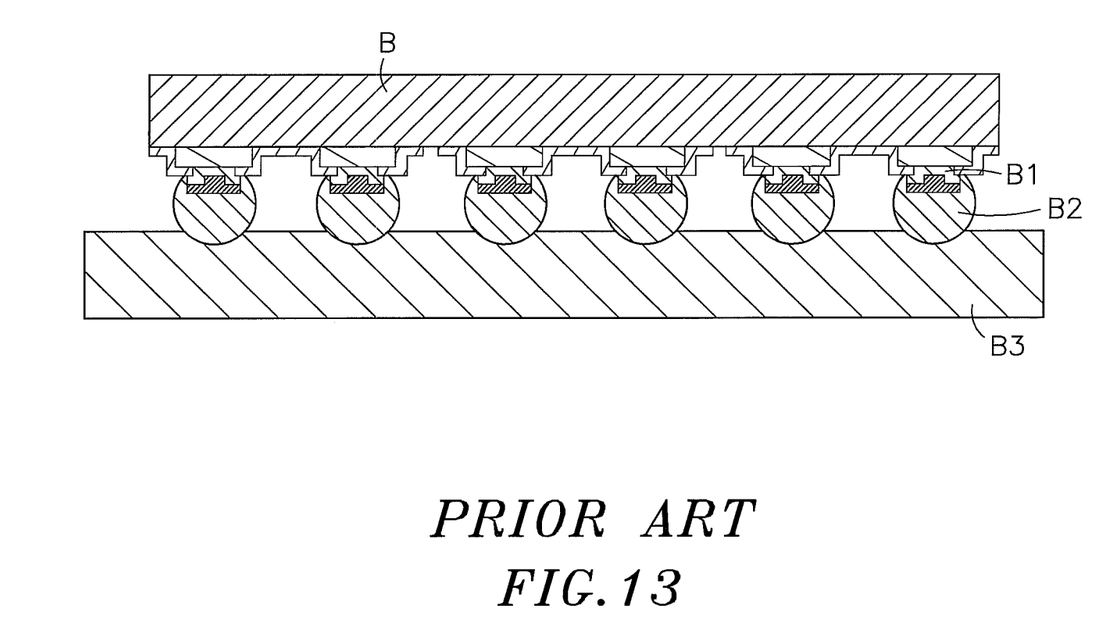
FIG. 13 is a sectional side view of another structure of rectifier diode according to the prior art.

Further, flip chip rectifier diodes are most popularly used in electronic products at the present time. After fabrication of bare chip diodes, they must be packaged by IC packaging companies. As shown in FIG. 13, bumps B1 are provided at the bottom side of the bare chip diode B, and then tin solder B2 is bonded between the bumps B1 and a carrier plate B3 to electrically couple the bare chip diode B to the circuit at the carrier plate B3. Further, an encapsulation or underfill process is then performed to finish the fabrication. This method has the drawback of high cost. Further, during operation of the bare chip diode, waste heat can be transferred through the bumps B1 and the tin solder B2 to the carrier plate B3 for dissipation. However, due to limited heat transfer area, waste heat cannot be quickly transferred to the carrier plate B3 for dissipation. Further, the presence of the bumps B1 and the tin solder B2 greatly increase the height of the finished product, not suitable for low profile application.

In the aforesaid flip chip rectifier diode structure and its fabrication method, bumps B1 or tin coating must be made prior to the process of bonding the bumps B1 or the bare chip diode B to the carrier plate B3. If gold is used to make the bumps B1, the cost will be very high. If silver or tin is used to reduce the cost, the product reliability will be relatively lowered. In order to improve heat transfer problem, an underfill process is necessary to fill a conducting adhesive between the bare chip diode B and the carrier plate B3. However, this added underfill process complicates the manufacturing process, extends the manufacturing time, and increases the manufacturing cost.

Therefore, it is desirable to provide a rectifier diode that eliminates the problems of the aforesaid prior art designs.

SUMMARY OF THE INVENTION

The present invention has been accomplished under the circumstances in view. It is therefore the main object of the present invention to provide a rectifier diode, which eliminates a packaging process, simplifying the manufacturing process and reducing the manufacturing cost.

To achieve this and other objects of the present invention, a rectifier diode comprises a substrate defining at least one pair of through holes, at least one bare chip diode positioned on the substrate to keep conducting grooves thereof in alignment with respective through holes of the substrate, and a conducting unit formed to secure the bare chip diode and the substrate tightly together and to electrically coupled the circuit of the substrate to the at least one bare chip diode. Thus, the bare chip diode(s) can be directly installed in the substrate and electrically coupled to the circuit of the substrate without any extra packaging process, such as bump bonding process, encapsulation process and/or underfill process, simplifying the manufacturing process and reducing the manufacturing cost.

In one embodiment of the present invention, the conducting unit comprises a metal interface layer, a conductive metal thin film and predetermined electrode pins and bond pads. After positioning of the bare chip diode(s) on the substrate and formation of the conducting unit to electrically couple the bare chip diode(s) to the circuit of the substrate. Thus, waste heat produced during operation of the bare chip diode can be transferred through the electrode pins to the substrate rapidly, enhancing quick heat dissipation.

Further, because bare chip diode(s) can be directly installed in the substrate and electrically coupled to the circuit of the substrate without bump bonding, encapsulation process or underfill, the invention matches height saving and is suitable for low profile electronic products.

Further, the substrate can be configured to provide four pairs of through holes for the mounting of four bare chip diodes in such a manner that these adjacent bare chip diodes have an inverse polarity to each other, and a metal interface layer, a conductive metal thin film and desired electrode pins and bond pads can then be processed to make a bridge rectifier.

Further, during fabrication of the rectifier diode, the invention uses at least one conducting medium to fill up each electroplating space and to form an electrode pin on the conductive metal thin film in each electroplating space and a bond pad at the bottom side of each electrode pin, reducing the rectifier diode manufacturing cost and enhancing the conducting effects of the rectifier diode.

In an alternate form of the present invention, a copper coating layer is covered on the conductive metal thin film in each electroplating space and each extension space, and then a conductive adhesive layer is bonded to the copper coating layer in each electroplating space, and then a surface copper layer is plated on the copper coating layer and the conductive adhesive layer. Thus, using the copper coating layer, the conductive adhesive layer and the surface copper layer to form the desired electrode pins and bond pads greatly saves the cost. Further, the conductive adhesive layer between the copper coating layer and the surface copper layer is electrically conductive and can fill up open spaces to prevent bubble formation, maintaining high levels of electrical conductivity and reducing manufacturing cost.

DETAILED DESCRIPTION OF THE PREFERRED EMBODIMENT

Referring to FIGS. 1-7, a rectifier diode in accordance with the present invention is shown comprising a substrate 1, a bare chip diode 2, and a conducting unit 3.

Figure 1:
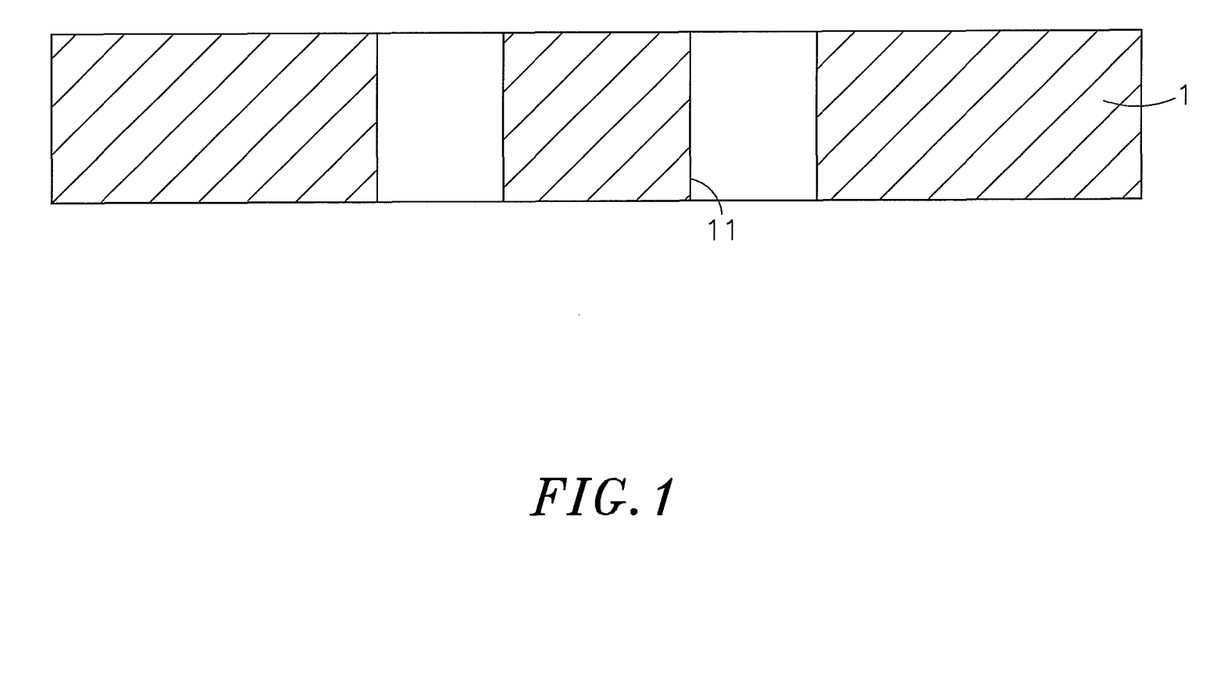
FIG. 1 is a sectional side view of a substrate for rectifier diode in accordance with the present invention.

The substrate 1 can be made out of ceramics, glass fibers, polyimide ammonium sulfite or phenolic resin, having at least one pair of through holes 11 extending through opposite top and bottom surfaces thereof. These through holes 11 can be made using laser drilling, machining or ceramic green sheet punching technique.

Figure 2:
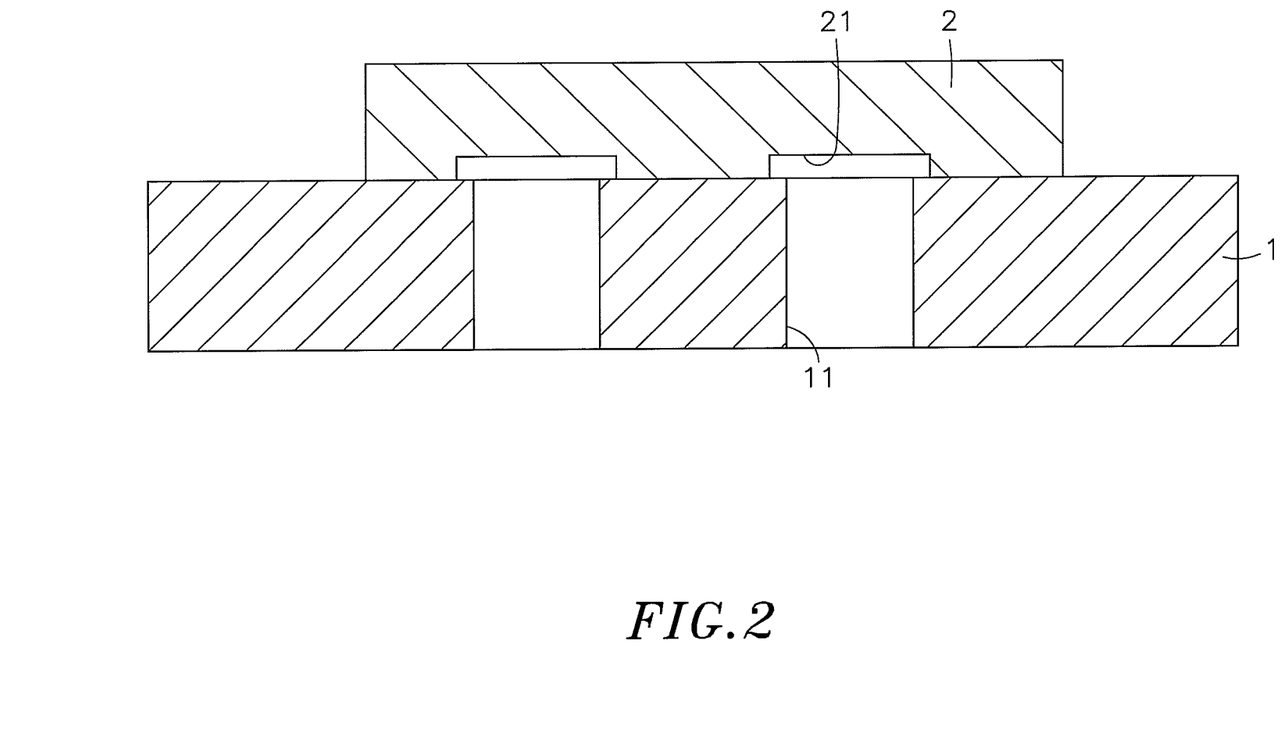
FIG. 2 corresponds to FIG. 1, illustrating an bare chip diode placed on the substrate.
Figure 3:
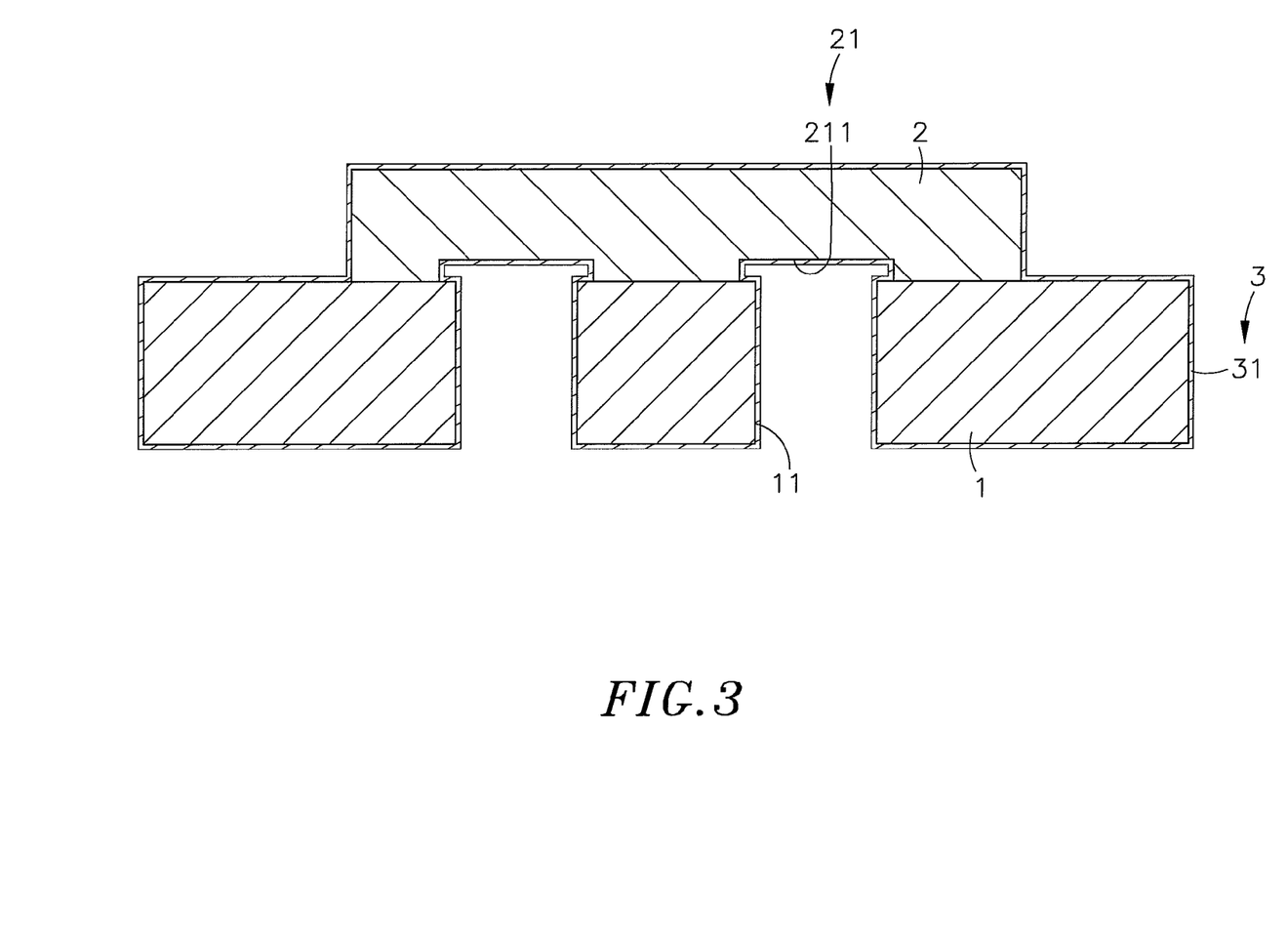
FIG. 3 corresponds to FIG. 2, illustrating a metal interface layer coated on the exposed surfaces of the bare chip diode and the substrate.
Figure 4:
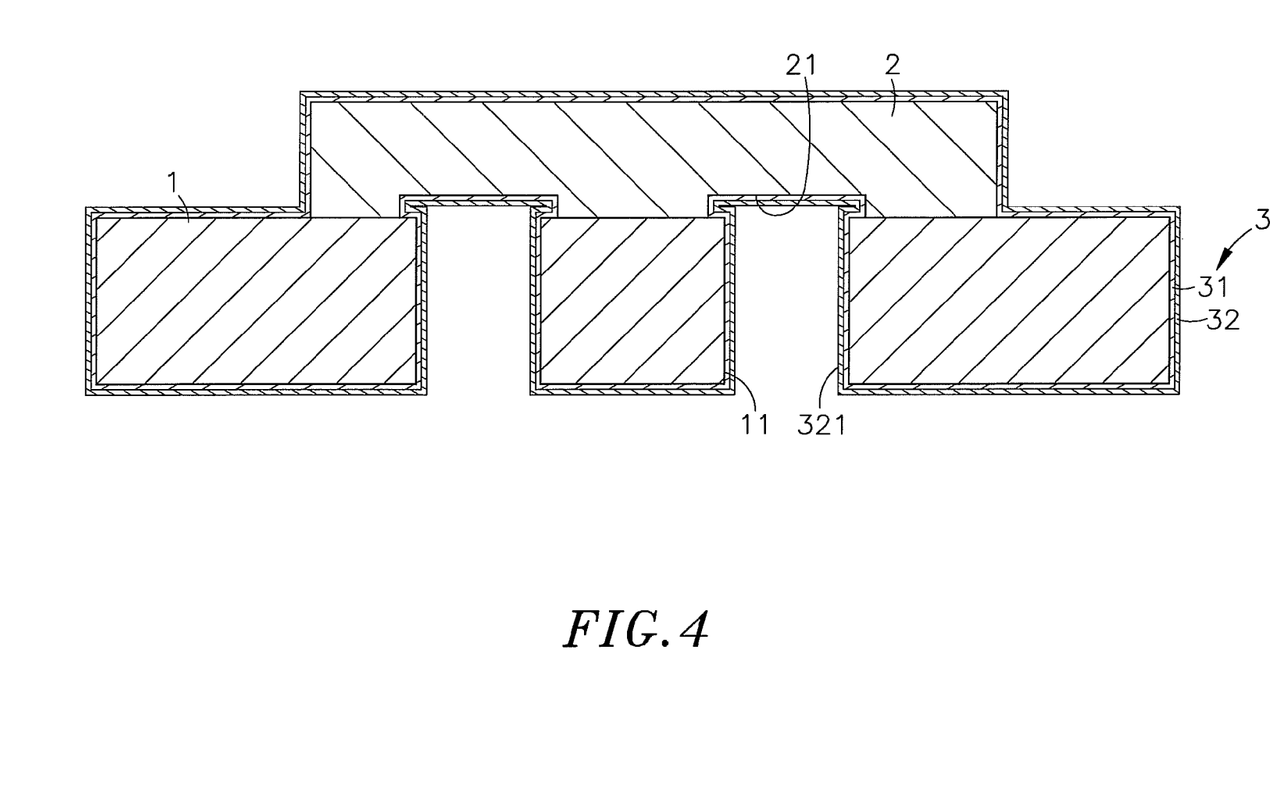
FIG. 4 corresponds to FIG. 3, illustrating a conductive metal thin film coated on the metal interface layer.
Figure 5:
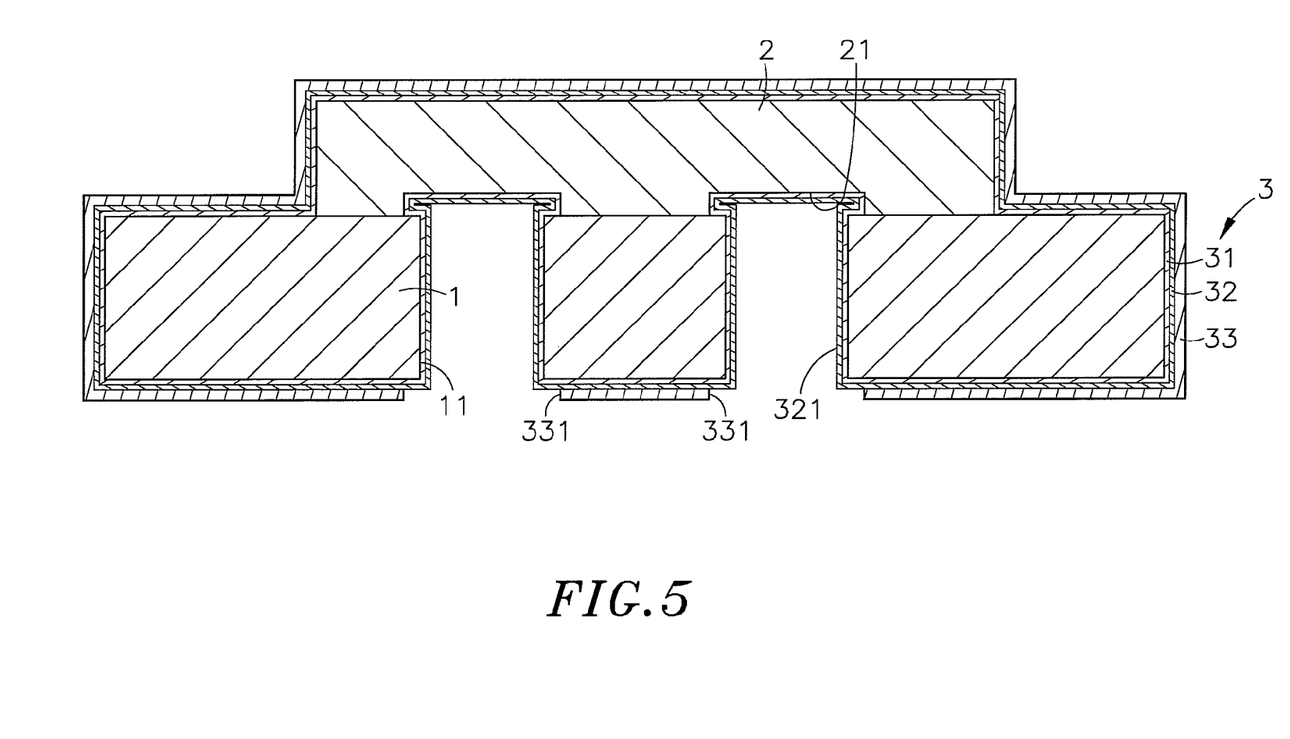
FIG. 5 corresponds to FIG. 4, illustrating an insulating layer formed in a predetermined pattern and covered on the external surface of the conductive metal thin film.
Figure 6:
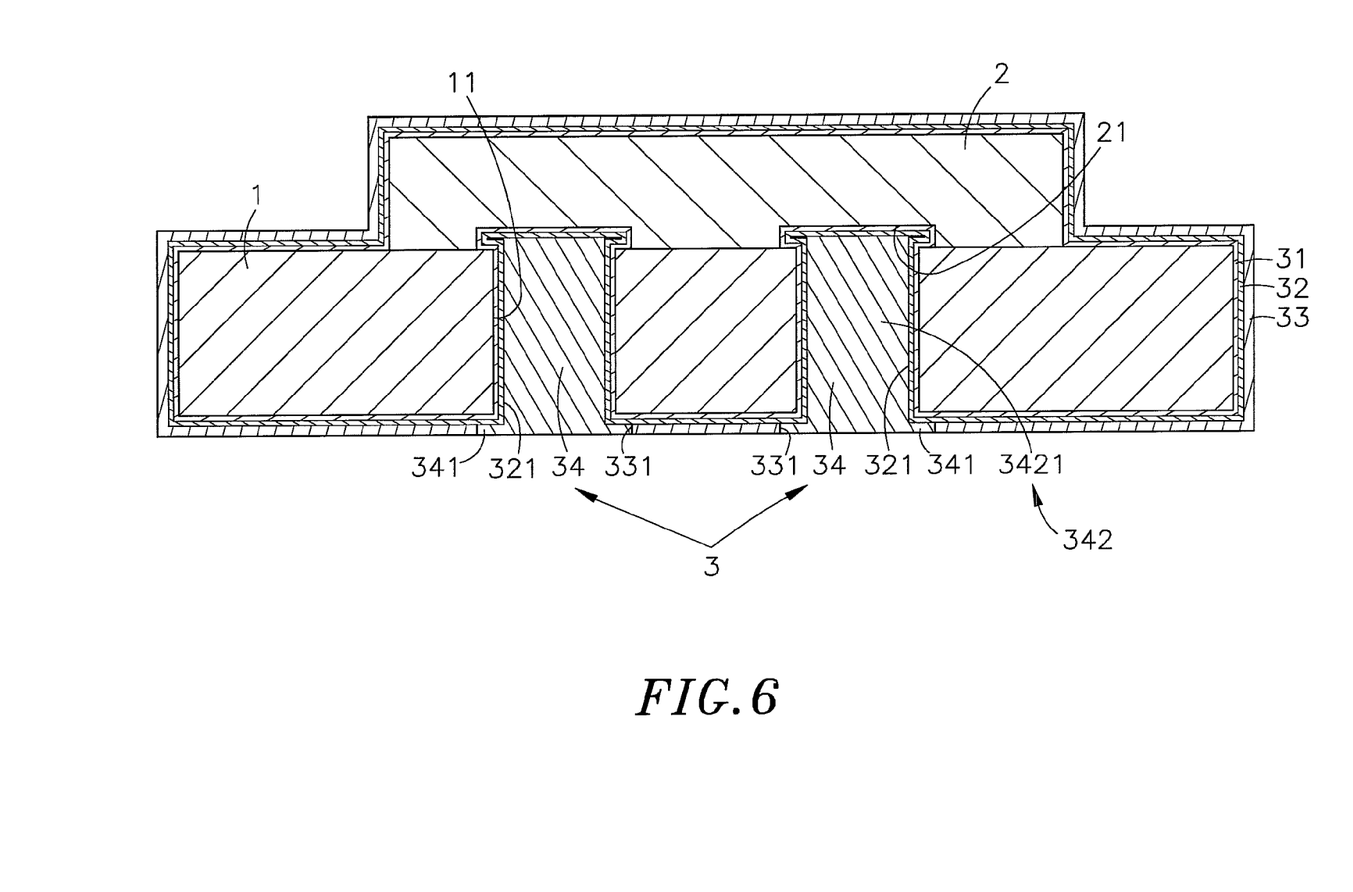
FIG. 6 corresponds to FIG. 5, illustrating a copper coating layer coated on the exposed surface of the conductive metal thin film.

The bare chip diode 2 is arranged on the top surface of the substrate 1, defining a pair of conducting grooves 21 in the bottom side thereof in communication with the respective through holes 11 of the substrate 1. In this embodiment, the number of the through holes 11 of the substrate 1 is two; the bare chip diode 2 comprises two conducting grooves 21 located in the bottom side thereof and respectively kept in communication with the two through holes 11 of the substrate 1. Further, the bare chip diode 2 is temporarily positioned on the top surface of the substrate 1 using a tool or non-conductive adhesive.

The conducting unit 3 comprises a metal interface layer 31 selected from the group of titanium, tungsten, nickel, chrome and their alloys and coated on the exposed surfaces of the bare chip diode 2 and the substrate 1 using a vacuum coating technique, a conductive metal thin film 32 covered over the metal interface layer 31 using vacuum copper deposition, chemical nickel plating or chemical copper plating technique and defining an electroplating space 321 within each through hole 11 of the substrate 1 and the corresponding conducting groove 21 of the bare chip diode 2, an insulating layer 33 of dry film or liquid photoresist formed in a predetermined pattern and covered on the external surface of the conductive metal thin film 32 using an exposure and development technique or printing technique and defining at least one pair, for example, two extension spaces 331 at the bottom side of the substrate 1 opposite to the bare chip diode 2 and beyond the insulating layer 33 corresponding to the respective electroplating spaces 321, at least one conducting medium 342 used to make a copper coating layer on the exposed surface of the conductive metal thin film 32 and to form an electrode pin 34 in each electroplating space 321 and a bond pad 341 in each extension space 331 in integration with one respective electrode pin 34. Thereafter, the insulating layer 33 is removed, and then an etching solution is applied to remove the conductive metal thin film 32 and the metal interface layer 31 from the substrate 1 and the bare chip diode 2, finishing the fabrication of the rectifier diode.

Referring to FIGS. 5-7 again, in one preferred embodiment of the present invention where the pins of the bare chip diode are horizontally extended out at opposing left and right sides. In this embodiment, the bare chip diode 2 defines two conducting grooves 21 in the bottom side thereof. These two conducting grooves 21 are bump grooves 211 of the bare chip diode 2 originally made in bare chip diode factory for the mounting of respective bumps. The bare chip diode 2 is arranged on the top surface of the substrate 1, keeping the two conducting grooves 21 in alignment with the respective through holes 11 of the substrate 1. The inner surface of each conducting groove 21 of the bare chip diode 2, the inner surface of each through hole 11 of the substrate 1 and a part of the bottom surface of the substrate 1 around each through hole 11 are covered by the metal interface layer 31 and the conductive metal thin film 32. Further, at least one conducting medium 342 is used to fill up each electroplating space 321, forming an electrode pin 34 on the conductive metal thin film 32 in each electroplating space 321 and a bond pad 341 at the bottom side of each electrode pin 34 over the surface area around each through hole 11.

Figure 7:
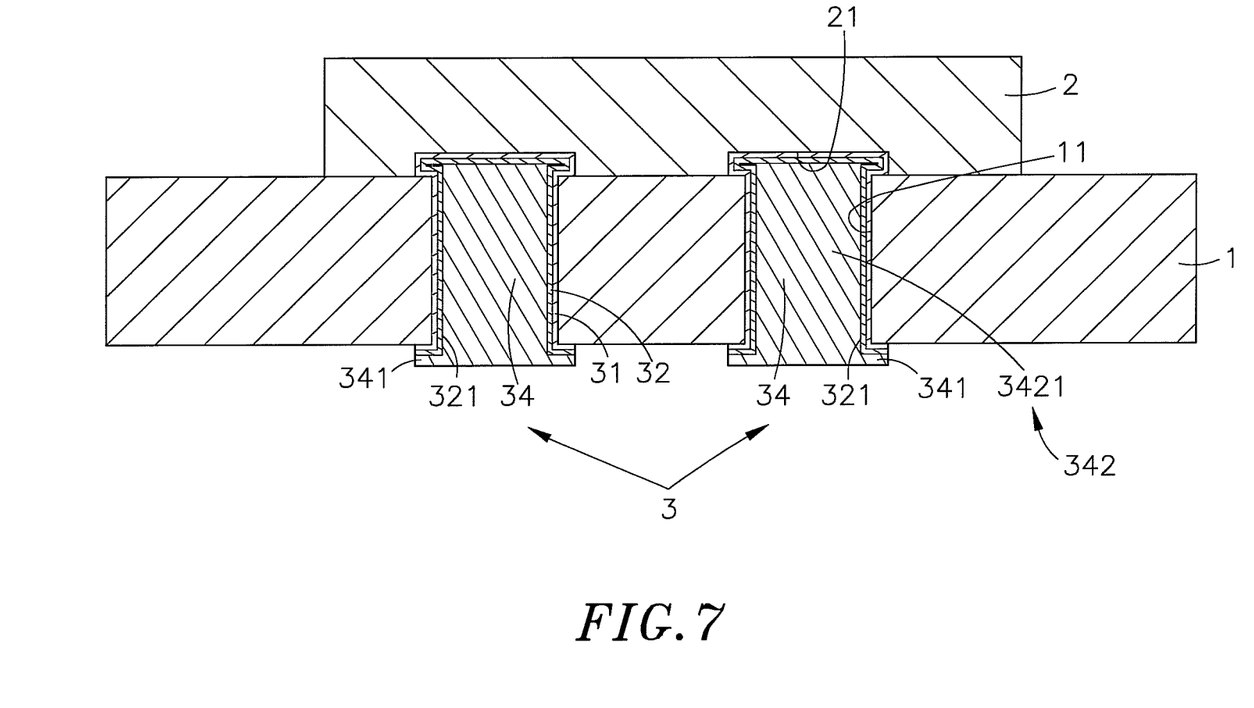
FIG. 7 corresponds to FIG. 6, illustrating the insulating layer, the conductive metal thin film and the metal interface layer removed from the substrate and the bare chip diode.

At this time, the metal interface layer 31, the conductive metal thin film 32, the electrode pins 34 and the bond pads 341 secure the bare chip diode 2 and the substrate 1 tightly together. Further, a predetermined circuit can be formed in the substrate 1 before or after installation of the bare chip diode 2, and then electrically coupled with the bare chip diode 2 after installation of the bare chip diode 2. Thus, after fabrication of the bare chip diode 2, it can be directly installed in the substrate 1 and electrically coupled to the circuit of the substrate 1 without any extra packaging process, such as bump bonding process, encapsulation process and/or underfill process, simplifying the manufacturing process and reducing the manufacturing cost.

Figure 8:
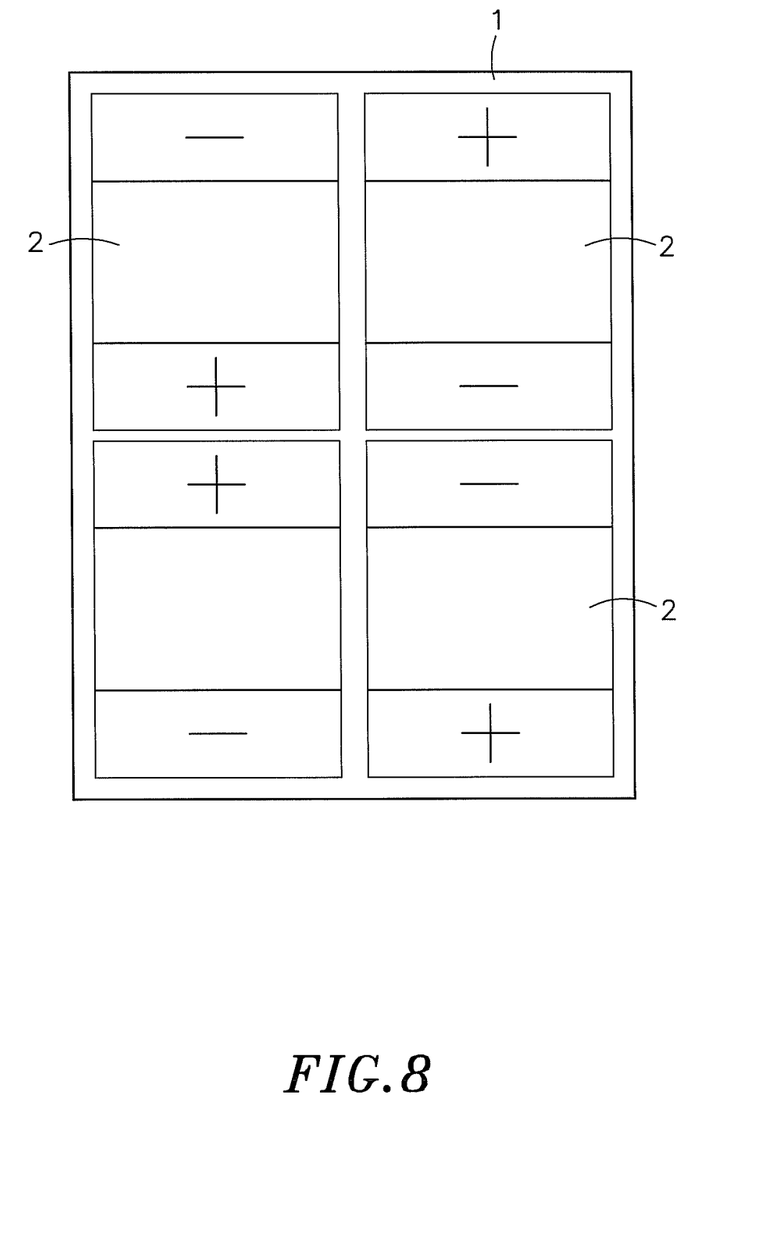
FIG. 8 is a top plain view of an alternate form of the rectifier diode in accordance with the present invention, illustrating four bare chip diodes on the top surface of the substrate.

Referring to FIG. 8 and FIG. 7 again, in another preferred embodiment of the present invention, the substrate 1 defines four pairs of through holes 11; four bare chip diodes 2 are arranged on the top surface of the substrate 1 in such a manner that these adjacent bare chip diodes 2 have an inverse polarity to each other, and each conducting groove 21 of each bare chip diode 2 is kept in communication with one respective through hole 11 of the substrate 1. The metal interface layer 31, the conductive metal thin film 32, the electrode pins 34 and the bond pads 341 are then formed using the same processing process. Thus, four bare chip diodes 2 can be installed in the substrate 1 and electrically coupled to the circuit of the substrate 1 in such a manner that the electrode pins 34 of each two adjacent bare chip diodes 2 of the same polarity are electrically connected together, and the other electrode pin 34 of each bare chip diode 2 is electrically coupled to the circuit of the substrate 1, forming a bridge rectifier.

The aforesaid laser drilling, machining, ceramic green sheet punching, vacuum copper deposition, chemical nickel plating, chemical copper plating, exposure and development technique or printing technique for pattern formation of insulating layer of dry film or liquid photoresist, etching technique for removal of conductive metal thin film and metal interface layer, all these techniques are of the known art and not within the scope of the invention. No further detailed description in this regard will be necessary.

Figure 9:
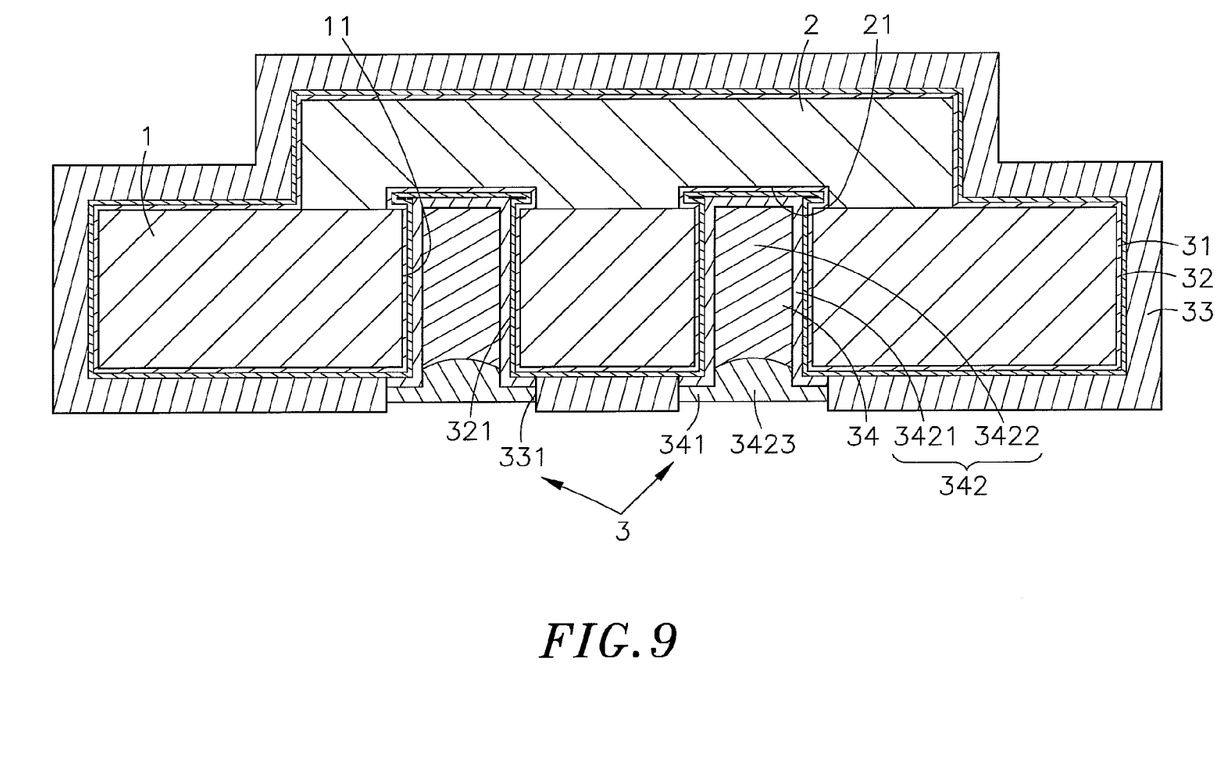
FIG. 9 is a sectional side view of the alternate form of the rectifier diode in accordance with the present invention.

Referring to FIG. 9 and FIG. 7 again, using at least one conducting medium 342 to fill up each electroplating space 321 and to form an electrode pin 34 on the conductive metal thin film 32 in each electroplating space 321 and a bond pad 341 at the bottom side of each electrode pin 34 can be done by: employing an electroplating technique to make a copper coating layer 3421 that fills up each electroplating space 321 and each extension space 331 to form the desired electrode pins 34 and bond pads 341. Using an electroplating technique to fill up each electroplating space 321 and each extension space 331 with pure copper is quite expensive. In order to reduce the cost, a copper coating layer 3421 can be covered on the conductive metal thin film 32 in each electroplating space 321 and each extension space 331, and then a conductive adhesive layer 3422 is bonded to the copper coating layer 3421 in each electroplating space 321, and then a surface copper layer 3423 is plated on the copper coating layer 3421 and the conductive adhesive layer 3422. Thus, using the copper coating layer 3421, the conductive adhesive layer 3422 and the surface copper layer 3423 to form the desired electrode pins 34 and bond pads 341 greatly saves the cost.

Because the material cost of the conductive adhesive layer 3422 is much cheaper than the material cost of the copper coating layer 3421, the manufacturing cost of the rectifier diode can be significantly reduced. Further, because the surface copper layer 3423 is formed on the surface of the copper coating layer 3421 for conducting, the conducting grooves 21 of the bare chip diode 2 can conduct electricity by means of the copper coating layer 3421 and the copper layer 3423. Further, the conductive adhesive layer 3422 between the copper coating layer 3421 and the surface copper layer 3423 is electrically conductive and can fill up open spaces to prevent bubble formation, maintaining high levels of electrical conductivity and reducing manufacturing cost.

Figure 10:
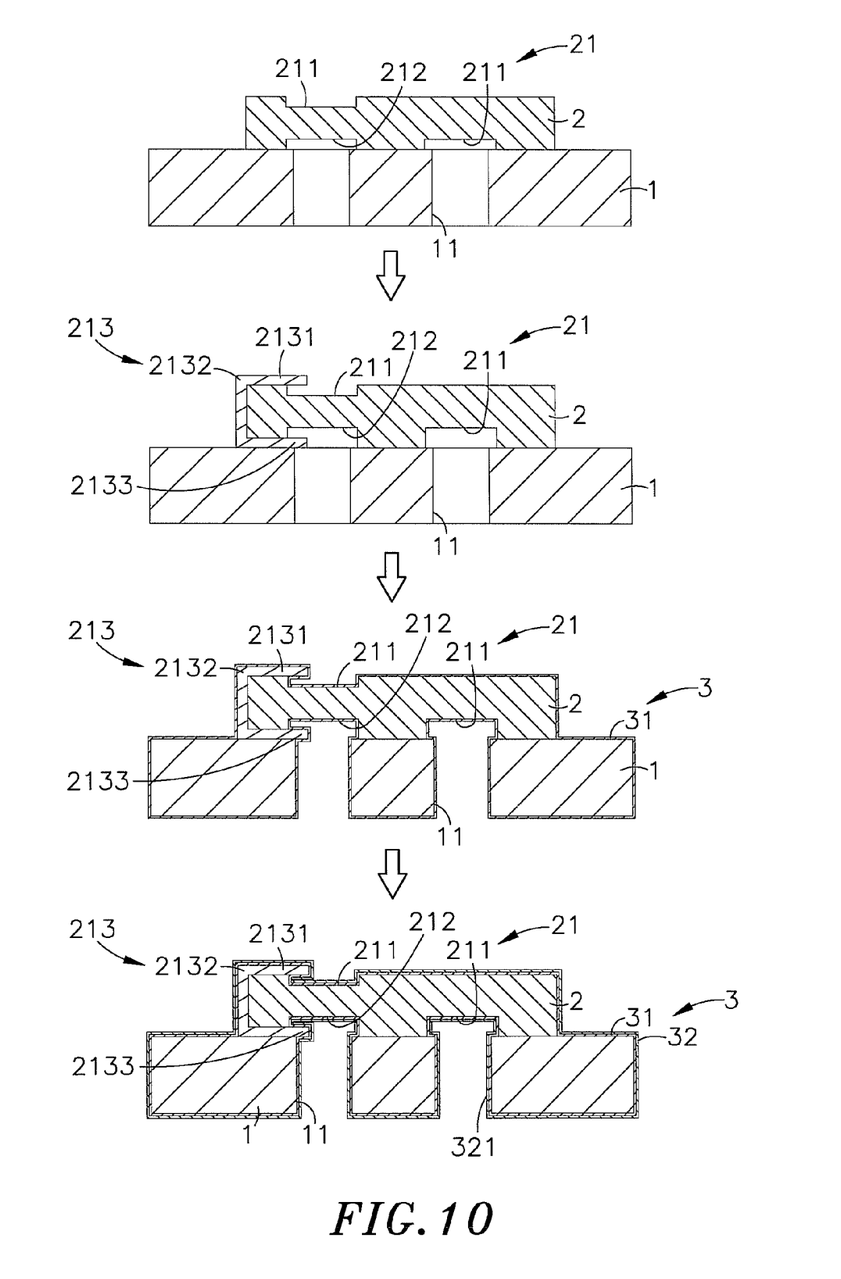
FIG. 10 is a schematic drawing illustrating the fabrication flow of the alternate form of the rectifier diode in accordance with the present invention (I).
Figure 11:
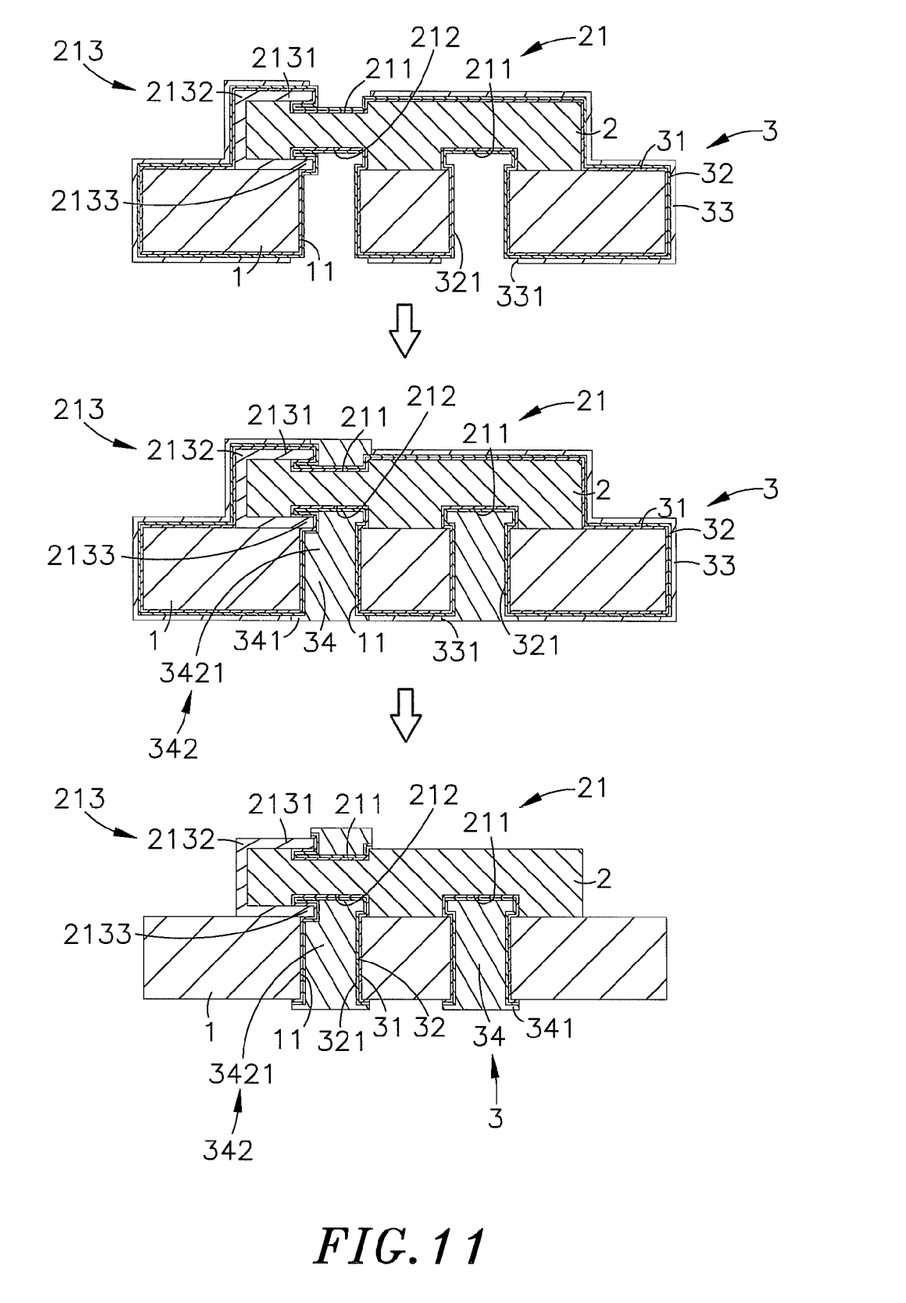
FIG. 11 is a schematic drawing illustrating the fabrication flow of the alternate form of the rectifier diode in accordance with the present invention (II).

Referring to FIGS. 10 and 11, in still another alternate form of the present invention where the pins of the bare chip diode extend in vertical direction. In this embodiment, the bare chip diode 2 defines two conducting grooves 21 in the bottom side thereof and one conducting groove 21 in the top side thereof, wherein the two conducting grooves 21 in the bottom side are classified as one bump groove 211 and one plating groove 212; the conducting groove 21 in the top side is classified as a bump groove 211. After positioning of the bare chip diode 2 on the top surface of the substrate 1 by using a tool or non-conductive adhesive, the bump groove 211 and plating groove 212 in the bottom side of the bare chip diode 2 are respectively kept in alignment with the respective through holes 11 of the substrate 1, and thereafter, a lead frame 213 is mounted at the bare chip diode 2 with a base portion 2131 thereof located at the top side and suspending above the bump groove 211 in the top side of the bare chip diode 2, a middle part 2132 thereof downwardly extended from the base portion 2131 along one vertical lateral side of the bare chip diode 2 and an end piece 2133 thereof perpendicularly extended from the bottom side of the middle part 2132 to the plating groove 212. Thereafter, the lead frame 213 is fixed in position using a non-conductive adhesive, and then a metal interface layer 31 is coated on the exposed surfaces of the bare chip diode 2 and the substrate 1 using a vacuum coating technique, and then a conductive metal thin film 32 is covered over the metal interface layer 31 using vacuum copper deposition, chemical nickel plating or chemical copper plating technique to define an electroplating space 321 in each through hole 11 of the substrate 1 and each corresponding conducting groove 21 of the bare chip diode 2, and then an insulating layer 33 is formed in a predetermined pattern and covered on the external surface of the conductive metal thin film 32 using an exposure and development technique or printing technique to define two extension spaces 331 at the bottom side of the substrate 1 opposite to the bare chip diode 2 and beyond the insulating layer 33 corresponding to the respective electroplating spaces 321. Then a conducting medium 342 is used to make a copper coating layer on the exposed surface of the conductive metal thin film 32, forming the electrode pins 34 and bond pads 341, and this procedure can be done by employing an electroplating technique to make a copper coating layer 3421 that fills up each electroplating space 321 and each extension space 331 to form the desired electrode pins 34 and bond pads 341. Thereafter, the insulating layer 33 and the conductive metal thin film 32 are removed, finishing the fabrication of the rectifier diode.

According to this alternate embodiment, the bare chip diode 2 defines one bump groove 211 and one plating groove 212 in the bottom side thereof and one bump groove 211 in the top side thereof. The bare chip diode 2 is placed on the top surface of the substrate 1 to keep the bottom-sided bump groove 211 and plating groove 212 thereof in alignment with the through holes 11 of the substrate 1. The inner surfaces of the bump groove 211 and plating groove 212 in the bottom side of the bare chip diode 2, the inner surfaces of the through holes 11 of the substrate 1 and a part of the bottom surface of the substrate around each through hole 11, a part of the top surface of the bare chip diode 2 around the bump groove 211 in the top side of the bare chip diode 2, the outer surfaces of the base portion 2131 and end piece 2133 of the bare chip diode 2 are covered by the metal interface layer 31 and the conductive metal thin film 32. After formation of the conductive metal thin film 32 on the metal interface layer 31, the conductive metal thin film 32 defines an electroplating space 321 within each through hole 11 of the substrate 1 and the corresponding conducting groove 21 of the bare chip diode 2. A conducting medium 342 is then used to make a copper coating layer on the exposed surface of the conductive metal thin film 32 and to form an electrode pin 34 in each electroplating space 321 and a bond pad 341 in integration with one respective electrode pin 34.

In this alternate form, an even number of bump grooves 211 are provided at opposing top and bottom sides of the bare chip diode 2 and at least one plating groove 212 is provided at the bottom side of the bare chip diode 2 corresponding to the amount of the bump groove 211 at the top side of the bare chip diode 2.

At this time, the metal interface layer 31, the conductive metal thin film 32, the electrode pins 34 and the bond pads 341 secure the bare chip diode 2 and the substrate 1 tightly together, the bump groove 211 at the top side of the bare chip diode 2 is electrically connected to the electrode pin 34 in the plating groove 212 in the bottom side of the bare chip diode 2 by the respective electrode pin 34 and the lead frame 213, and the circuit in the substrate 1 is electrically coupled with the bare chip diode 2.

In actual application, the rectifier diode of the present invention has advantages and features as follows:

1. The bare chip diode 2 is positioned on the substrate 1 to keep the conducting grooves 21 thereof in alignment with the respective through holes 11 of the substrate 1, and then a metal interface layer 31 and a conductive metal thin film 32 and the desired electrode pins 34 and bond pads 341 are formed to secure the bare chip diode 2 and the substrate 1 tightly together, and the circuit that is formed in the substrate 1 before or after installation of the bare chip diode 2 is electrically coupled with the bare chip diode 2. Thus, after fabrication of the bare chip diode 2, it can be directly installed in the substrate 1 and electrically coupled to the circuit of the substrate 1 without any extra packaging process, such as bump bonding process, encapsulation process and/or underfill process, simplifying the manufacturing process and reducing the manufacturing cost.
2. The bare chip diode 2 is mounted on the substrate 1 and electrically coupled to the circuit of the substrate 1 by the metal interface layer 31 and the conductive metal thin film 32 and the electrode pins 34, and therefore waste heat produced during operation of the bare chip diode 2 can be transferred through the electrode pins 34 to the substrate 1 rapidly, enhancing quick heat dissipation.
3. After fabrication of the bare chip diode 2, the bare chip diode 2 can be directly installed in the substrate 1 and electrically coupled to the circuit of the substrate 1 without bump bonding, encapsulation process or underfill process, matching height saving and suitable for low profile electronic products.
4. The substrate 1 can be configured to provide four pairs of through holes 11 for the mounting of four bare chip diodes 2 in such a manner that these adjacent bare chip diodes 2 have an inverse polarity to each other, and a metal interface layer 31, a conductive metal thin film 32 and desired electrode pins 34 and bond pads 341 can then be processed to make a bridge rectifier.
5. Using at least one conducting medium 342 to fill up each electroplating space 321 and to form an electrode pin 34 on the conductive metal thin film 32 in each electroplating space 321 and a bond pad 341 at the bottom side of each electrode pin 34 can be done by: employing an electroplating technique to make a copper coating layer 3421 that fills up each electroplating space 321 and each extension space 331 to form the desired electrode pins 34 and bond pads 341.
6. In order to reduce the cost, a copper coating layer 3421 is covered on the conductive metal thin film 32 in each electroplating space 321 and each extension space 331, and then a conductive adhesive layer 3422 is bonded to the copper coating layer 3421 in each electroplating space 321, and then a surface copper layer 3423 is plated on the copper coating layer 3421 and the conductive adhesive layer 3422. Thus, using the copper coating layer 3421, the conductive adhesive layer 3422 and the surface copper layer 3423 to form the desired electrode pins 34 and bond pads 341 greatly saves the cost. Further, the conductive adhesive layer 3422 between the copper coating layer 3421 and the surface copper layer 3423 is electrically conductive and can fill up open spaces to prevent bubble formation, maintaining high levels of electrical conductivity and reducing manufacturing cost.

In conclusion, the invention is characterized by: positioning an bare chip diode 2 on a substrate 1 to keep conducting grooves 21 of the bare chip diode 2 in alignment with the respective through holes 11 of the substrate 1, and then forming a metal interface layer 31 and a conductive metal thin film 32 and desired electrode pins 34 and bond pads 341 to secure the bare chip diode 2 and the substrate 1 tightly together, and then electrically coupling the circuit of the substrate 1 to the bare chip diode 2. Thus, after fabrication of the bare chip diode 2, the bare chip diode 2 can be directly installed in the substrate 1 and electrically coupled to the circuit of the substrate 1 without any extra packaging process, such as bump bonding process, encapsulation process and/or underfill process, simplifying the manufacturing process and reducing the manufacturing cost.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A rectifier diode, comprising:
   a substrate comprising at least one pair of through holes cut through opposing top and bottom surfaces thereof;
   at least one bare chip diode placed on the top surface of said substrate, each said bare chip diode comprising an even number of conducting grooves respectively kept in alignment with respective through holes of said substrate; and
   a conducting unit comprising a metal interface layer coated on exposed surfaces of each said bare chip diode and said substrate, a conductive metal thin film covered over said metal interface layer and defining an electroplating space within each through hole of said substrate and the corresponding conducting groove of one said bare chip diode, and at least one conducting medium coated in each said electroplating space to form an electrode pin in each said electroplating space and a bond pad at the bottom surface of said substrate in integration with one respective said electrode pin.

2. The rectifier diode as claimed in claim 1, wherein said substrate comprises one pair of through holes cut through the opposing top and bottom surfaces thereof; said bare chip diode comprises two conducting grooves that are bump grooves located at a bottom side thereof and originally made during fabrication of said bare chip diode respectively aimed at the two through holes of said substrate.

3. The rectifier diode as claimed in claim 1, wherein said substrate comprises four pairs of through holes cut through the opposing top and bottom surfaces thereof; four said bare chip diodes are placed on the top surface of said substrate adjacent to one another in such a manner that these adjacent bare chip diodes have an inverse polarity to each other, and each conducting groove of each said bare chip diode is kept in communication with one respective through hole of said substrate.

4. The rectifier diode as claimed in claim 1, wherein said conducting unit comprises one single conducting medium of copper coated in each said electroplating space to form an electrode pin in each said electroplating space and a bond pad at the bottom surface of said substrate in integration with one respective said electrode pin using an electroplating technique.

5. The rectifier diode as claimed in claim 1, wherein said at least one conducting medium of said conducting unit comprises a conductive metal thin film electroplated in each said electroplating space and a part of the bottom surface of said substrate around each said electroplating space, a copper coating layer on a surface of the conductive metal thin film, a conductive adhesive layer bonded to said copper coating layer in each said electroplating space, and a surface copper layer plated on said copper coating layer and said conductive adhesive layer to form said electrode pins and said bond pads.

6. The rectifier diode as claimed in claim 1, wherein said substrate is selected from the group of ceramics, glass fibers, polyimide ammonium sulfite and phenolic resin.

7. The rectifier diode as claimed in claim 1, wherein said through holes of said substrate are made using one of laser drilling, machining and ceramic green sheet punching techniques.

* * * * *